United States Patent [19]
Goto

[11] Patent Number: 5,107,514
[45] Date of Patent: Apr. 21, 1992

[54] SEMICONDUCTOR OPTICAL ELEMENT
[75] Inventor: Katsuhiko Goto, Itami, Japan
[73] Assignee: Mitsubishi Denki Kabushiki Kaisha, Japan
[21] Appl. No.: 588,807
[22] Filed: Sep. 27, 1990
[30] Foreign Application Priority Data
  Apr. 13, 1990 [JP] Japan .................. 2-98628
[51] Int. Cl.$^5$ .............................................. H01S 3/19
[52] U.S. Cl. ..................................... 372/46; 372/45; 357/4; 357/16; 357/17
[58] Field of Search .................. 372/45, 46; 357/16, 357/17, 4

[56] References Cited
U.S. PATENT DOCUMENTS

| | | | |
|---|---|---|---|
| 4,815,087 | 3/1989 | Hayashi | 372/45 |
| 4,916,708 | 4/1990 | Hayakawa | 372/45 |
| 4,932,033 | 6/1990 | Miyazawa et al. | 372/46 |
| 4,961,197 | 10/1990 | Tanaka et al. | 372/45 |
| 4,964,134 | 10/1990 | Westbrook et al. | 372/45 |
| 4,974,231 | 11/1990 | Gomyo | 372/45 |
| 4,982,409 | 1/1991 | Kinoshita et al. | 372/45 |

OTHER PUBLICATIONS

Gessner et al, "GaInAs/AlGaInAs . . . Pressure MOVPE", Electronics Letters, vol. 25, No. 8, Apr. 1989, pp. 516–517.

*Primary Examiner*—Georgia Epps
*Attorney, Agent, or Firm*—Leydig, Voit & Mayer

[57] ABSTRACT

A semiconductor optical element includes a quantum well structure having a crystalline well layer of $(Al_xGa_{1-x})_{1-z}In_zP_yAs_{1-y}$ ($0 \leq x < 1$, $0 \leq y < 1$, $0 < z < 1$) having a lattice constant that matches crystalline InP and two barrier layers of crystalline $(Al_{x'}Ga_{1-x'})_{1-z}In_zP_yAs_{1-y}$ ($x < x' \leq 1$) having lattice constant that matches crystalline wherein and at least a portion of the quantum well structure is disordered.

5 Claims, 3 Drawing Sheets

SEMICONDUCTOR OPTICAL ELEMENT

FIELD OF THE INVENTION

The present invention relates to a semiconductor optical element such as a semiconductor laser, a semiconductor waveguide or a semiconductor optical modulator. More particularly, the invention relates to a semiconductor optical element having a quantum well structure having a disordered region.

BACKGROUND OF THE INVENTION

A semiconductor quantum well structure can be used to produce a laser having superior characteristics such as a low current threshold value where it is used as the active layer of the semiconductor laser and it can realize a waveguide having a low loss where it is used as a light waveguide. Furthermore, it has quite a wide range of possible applications to a variety of optical devices or modulators utilizing the electric field effect of its optical non-linearity or exciton absorption of a room temperature exciton.

In addition, the quantum well structure may be disordered by an impurity diffusion and thermal annealing thereby to become a layer of uniform composition. By utilizing this disordering, a planar waveguide and built-in type can be easily produced.

In a semiconductor laser or waveguide utilizing a quantum well structure of AlGaAs/GaAs series having a wavelength less than 1 micron, that is, the so-called short wavelength range, a number of examples utilizing disordering are reported. Because the lattice constant of $Al_xGa_{1-x}As$ does not vary with the Al composition ratio x, even if the quantum well structure becomes a layer of uniform composition by the disordering, lattice mismatching does not occur.

On the other hand, in a so-called long wavelength optical element in the 1 micron wavelength range, InGaAsP/InP series materials are usually used. $In_{1-x}Ga_xAs_yP_{1-y}$ has a lattice constant varying with the composition ratio, that is, the values of x and y. As an example of a long wavelength range quantum well structure which is usually used, an $In_{0.53}Ga_{0.47}As/InP$ quantum well structure is shown in FIG. 5 and its energy band diagram is shown in FIG. 6. In these figures, reference numeral 51 designates an $In_{0.53}Ga_{0.47}As$ well layer, reference numeral 52 designates an InP barrier layer, reference numerals 53 and 54 designate InP cladding layers, reference numeral 61 designates a conduction band edge, and reference numeral 62 designates a valence band edge. The lattice constant of $In_{0.53}Ga_{0.47}As$ layer 51 is approximately equal to the lattice constants of InP layers 52, 53, and 54.

When Si is diffused into the region 56 which is represented by the diagonal lines in the quantum well structure of FIG. 5, the portion where Si is diffused among the quantum well structure layers comprising $In_{0.53}Ga_{0.47}As$ well layer 51 and InP barrier layer 52 is disordered to an $In_{1-x}Ga_xAs_yP_{1-y}$ layer 57 of uniform composition, and it has a lattice constant different from that of the original $In_{0.53}Ga_{0.47}As$ well layer 51 and the InP barrier layer 52. As a result, strain due to the lattice mismatching occurs at the boundary 55 between the portion where the quantum well structure is disordered and the portion where it is not disordered. This strain causes dislocations occurring at the boundary. For example, when the quantum well structure comprising above described materials is used for a the active layer of a laser and an active region is produced by disordering, the dislocations generated at the boundary increase during laser operation thereby to deteriorate the laser, resulting in poor reliability. In addition, because the strain due to the lattice mismatching suppresses the displacement of atoms and prevents disordering, a uniform composition layer is not obtained.

A prior art long wavelength, that is, 1 micron range semiconductor optical element has a quantum well structure comprising materials as described above. Therefore, when the disordering is carried out as described above, strain due to lattice mismatching occurs at the boundary between the disordered portion and the non-disordered portion, thereby effecting unfavorable influences on the element characteristics. This prevents realization of a device utilizing disordering of a quantum well structure in a one micron range, long wavelength optical element.

SUMMARY OF THE INVENTION

It is an object of the present invention to provide a long wavelength optical element that utilizes disordering of a quantum well structure and has no lattice mismatching.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a semiconductor optical element includes a quantum well structure having a well layer of $In_{0.53}Ga_{0.47}As$ and a barrier layer of $(Al_xGa_{1-x})_{0.47}In_{0.53}As$ and a portion of the quantum well structure is disordered by diffusion of impurities to produce a uniform composition layer.

In the semiconductor optical element according to the present invention, the concentration of As and In in the well layer and the barrier layer of the quantum well structure are equal to each other. Therefore, when it is disordered, only Al and Ga replaced each other to produce a uniform composition $(Al_yGa_{1-y})_{0.47}In_{0.53}As$ layer. Because the lattice constant of $(Al_yGa_{1-y})_{0.47}In_{0.53}As$ does not change with the Al composition ratio y, the disordered layer has approximately the same lattice constant as the original quantum well layer and there occurs no lattice mismatching at the boundary by the disordering.

DETAILED DESCRIPTION OF THE PREFERRED EMBODIMENTS

An embodiment of the present invention will be described in detail with reference to the drawings.

Figure 1:
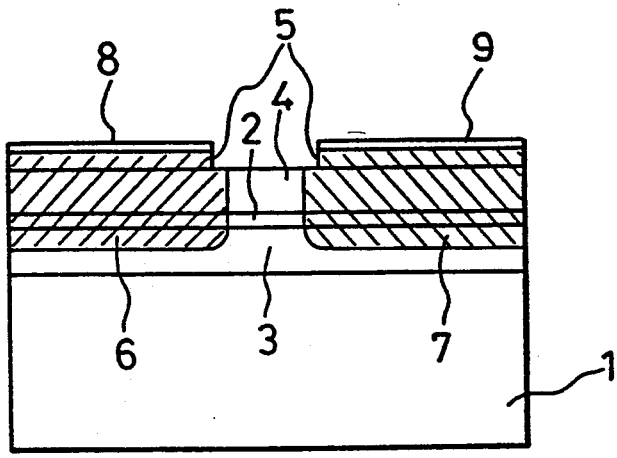
FIG. 1 is a cross-sectional view showing a semiconductor laser according to an embodiment of the present invention.

FIG. 1 is a cross-sectional view showing a semiconductor laser as a semiconductor optical element according to an embodiment of the present invention. In FIG. 1, reference numeral 1 designates a semi-insulating InP substrate, reference numeral 2 designates an $In_{0.53}Ga_{0.47}As/(Al_{0.3}Ga_{0.7})_{0.47}In_{0.53}As$ quantum well structure, reference numeral 3 designates a p type $(Al_{0.8}Ga_{0.2})_{0.47}In_{0.53}As$ cladding layer, reference numeral 4 designates an n type $(Al_{0.8}Ga_{0.2})_{0.47}In_{0.53}As$ cladding layer, reference numeral 5 designates an $In_{0.53}Ga_{0.47}As$ contact layer, reference numeral 6 designates a Si diffused region, reference numeral 7 designates a Zn diffused region. Reference numerals 8 and 9 designate an n side electrode and a p side electrode, respectively.

Figure 2:
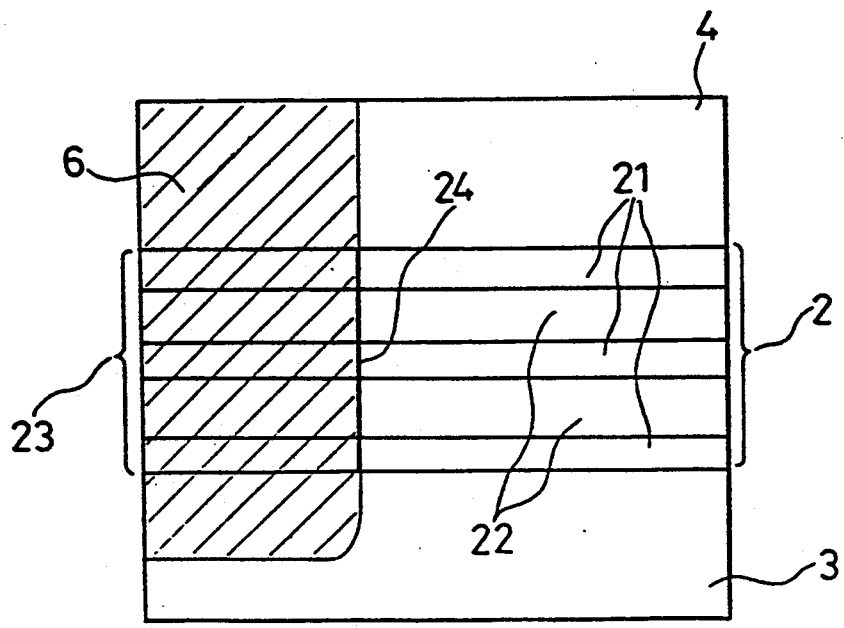
FIG. 2 is a diagram showing a portion of the quantum well layer and the neighborhood thereof of FIG. 1 in an enlarged view.
Figure 3:
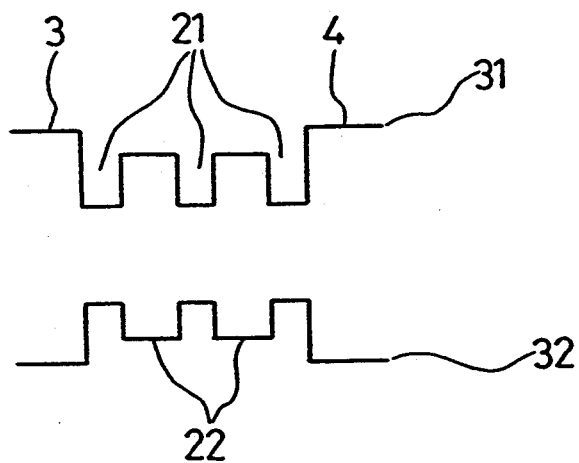
FIG. 3 is a diagram showing the energy band structure of the quantum well layer of an embodiment of the present invention.

FIG. 2 shows the quantum well structure 2 and the neighborhood thereof of FIG. 1 in an enlarged view, and FIG. 3 shows an energy band diagram of the quantum well layer. In these figures, reference numeral 21 designates an $In_{0.53}Ga_{0.47}As$ well layer, reference numeral 22 designates an $(Al_{0.3}Ga_{0.7})_{0.47}In_{0.53}As$ barrier layer, reference numeral 23 designates an $(Al_yGa_{1-y})_{0.47}In_{0.53}As$ layer of uniform composition which is disordered. Reference numeral 24 designates a boundary between the disordered region and the non-disordered region. Reference numeral 31 designates a conduction band edge and reference numeral 32 designates a valence band edge.

The semiconductor laser is produced by the following process steps.

First of all, a p type $(Al_{0.8}Ga_{0.2})_{0.47}In_{0.53}As$ cladding layer 3, an $In_{0.53}Ga_{0.47}As/(Al_{0.3}Ga_{0.7})_{0.47}In_{0.53}As$ quantum well structure 2, an n type $(Al_{0.8}Ga_{0.2})_{0.47}In_{0.53}As$ cladding layer 4, and an $In_{0.53}Ga_{0.47}As$ contact layer 5 are successively grown by MOCVD or MBE. Next, leaving a stripe shaped region of approximately 2 microns width which is to become an active region, Si is selectively diffused the structure at one side of the stripe shaped region and Zn is selectively diffused into the structure at the other side thereof, thereby to produce Si diffused region 6 and Zn diffused region 7. Finally, a pn junction which is produced in the $In_{0.53}Ga_{0.47}As$ contact layer 5 is removed by etching, and an n side electrode 8 is produced at the surface of the Si diffused region 6 and a p side electrode 9 is produced at the surface of the Zn diffused region 7. During the above-described production process, while performing Si diffusion or Zn diffusion, Al and Ga move between the $In_{0.53}Ga_{0.47}As$ well layer 21 and $(Al_{0.3}Ga_{0.7})_{0.47}In_{0.53}As$ barrier layer 22 in the quantum well structure 2, thereby resulting in uniform concentration. On the other hand, because In and As have the same concentration in both layers 21 and 22, a change in the concentration of these elements does not occur. Therefore, as a result of the disordering by the impurity diffusion, the quantum well structure 2 becomes a uniform composition $(Al_yGa_{1-y})_{0.47}In_{0.53}As$ layer 23.

Figure 4:
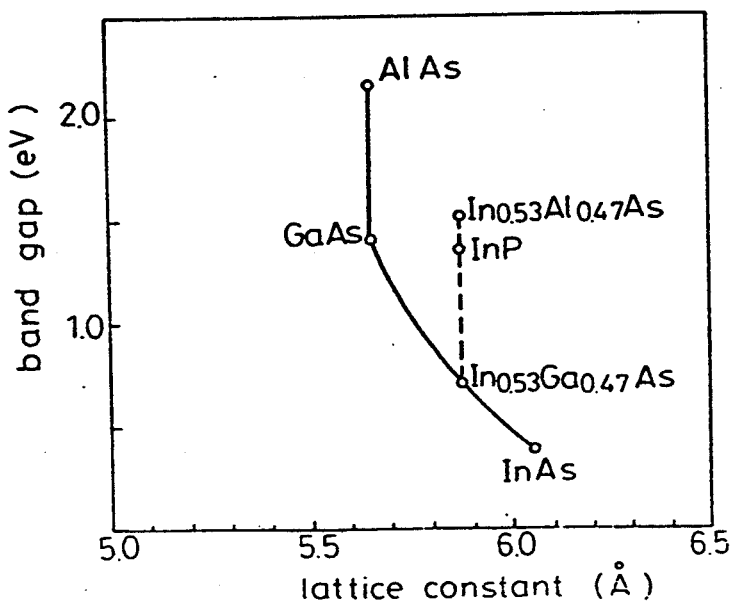
FIG. 4 is a diagram showing the lattice constant and energy band gap of AlGaInAs.
Figure 6:
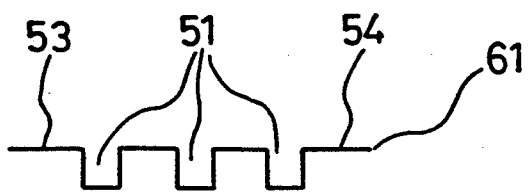
FIG. 6 is a diagram showing the energy band structure of the prior art $In_{0.53}Ga_{0.47}As/InP$ quantum well structure.
Figure 6:
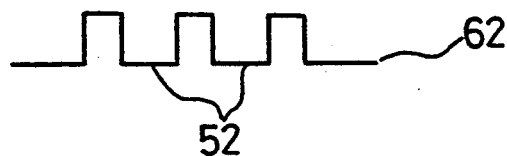
Figure 5:
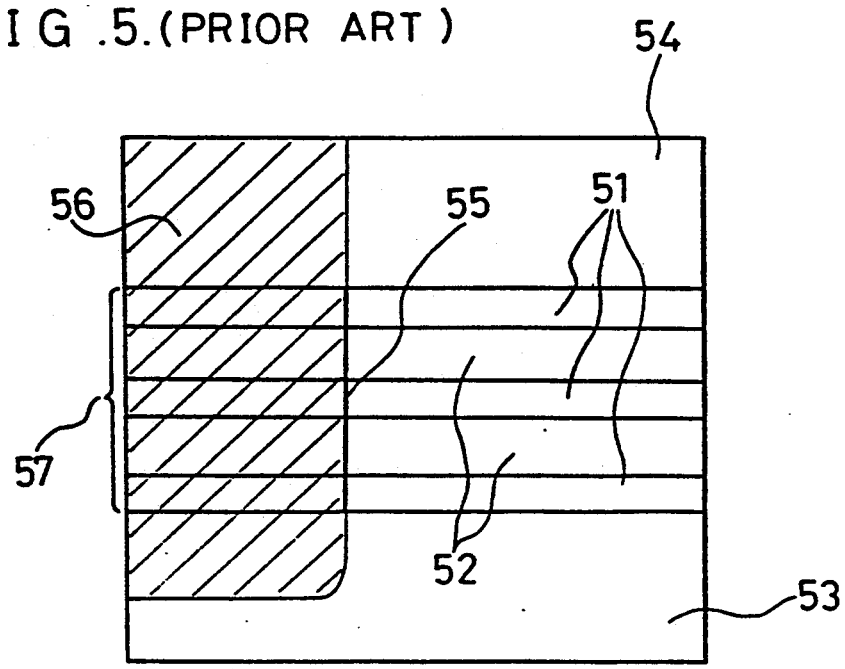
FIG. 5 is a diagram showing a prior art $In_{0.53}Ga_{0.47}As/InP$ quantum well structure.

FIG. 4 shows the lattice constant and energy band gap of AlGaInAs. In FIG. 4, the composition represented by $(Al_xGa_{1-x})_{0.47}In_{0.53}As$ ($0 \leq x \leq 1$) is depicted on the broken line and it has approximately the same lattice constant as that of InP for any value of x. From this fact, the $(Al_yGa_{1-y})_{0.47}In_{0.53}As$ layer produced by the disordering has the same lattice constant as that of the $In_{0.53}Ga_{0.47}As$ well layer 21 and $(Al_{0.3}Ga_{0.7})_{0.47}In_{0.53}As$ barrier layer 22, and there arises no lattice mismatching at the boundary 24 shown in FIG. 2.

Therefore, there arises no deterioration in the active layer due to the generation of dislocations, resulting in a high reliability element. Furthermore, because there occurs no lattice mismatching, disordering is not prevented, resulting in a completely uniform composition layer.

In this semiconductor laser, a current flows and is concentrated in the stripe shaped active region by the potential barrier of the pn junction, thereby causing laser oscillation. In addition, the $(Al_yGa_{1-y})_{0.47}In_{0.53}As$ layer which is produced by the disordering has a higher energy band gap than the $In_{0.53}Ga_{0.47}As$ well layer 21 of the active layer and has a lower refractive index than the $In_{0.53}Ga_{0.47}As/(Al_{0.3}Ga_{0.7})_{0.47}In_{0.53}As$ quantum well structure 2. Therefore, confinement of injected carriers and confinement of light are performed efficiently. In other words, by utilizing the disordering of the quantum well structure, it is possible to quite easily produce an active region or a waveguide in a planar structure. Herein, in this semiconductor laser, laser light of a wavelength in a range of 1.3 to 1.6 microns is obtained.

In the above-illustrated embodiment a planar type laser utilizing diffusion of p and n type impurities is illustrated, but the structure of laser can be any structure utilizing disordering of a quantum well structure.

In the above-illustrated embodiment the well layer comprises $In_{0.53}Ga_{0.47}As$ layer, but the well layer can be an $(Al_xGa_{1-x})_{0.47}Ga_{0.53}As$ layer (herein, x is selected such that the energy band gap of the well layer is less than that of the barrier layer), and in this case, a laser having a shorter wavelength than in the above described embodiment is realized.

In the above-illustrated embodiment a semiconductor laser is described, but a waveguide or an optical modulator, an optical amplifier, an optical switch, or an optical bistable element can employ the invention.

In the above-illustrated embodiment the disordering of a quantum well structure is carried out by diffusion of impurities, but the disordering can be performed by other methods such as ion implantation, annealing or laser irradiation.

In the above-illustrated embodiment the quantum well structure does not include phosphorus, but semiconductors including phosphorus can be used, for example, the well layer can comprise $In_{0.65}Ga_{0.35}As_{0.79}P_{0.21}$ and the barrier layer can comprise $(Al_{0.3}Ga_{0.7})_{0.35}In_{0.65}As_{0.79}P_{0.21}$. The above-described composition layers lattice match with InP. When the quantum well structure comprising the above-described layers is disordered, $(Al_xGa_{1-x})_{0.35}In_{0.65}As_{0.79}P_{0.21}$ ($x<0.3$) of uniform composition is obtained, but the lattice constant is equal to that of the original well and barrier layers, resulting in no lattice mismatching.

As is evident from the foregoing description, according to the present invention, a quantum well structure is $(Al_xGa_{1-x})_{1-z}In_zP_yAs_{1-y}$ which lattice matches with InP and it is disordered. Therefore, a long wavelength quantum well optical element is easily obtained and there arises no lattice mismatching, providing a high reliability element.

What is claimed is:

1. A semiconductor optical element comprising:
a quantum well structure comprising a well layer of crystalline $(Al_xGa_{1-x})_{1-z}In_zP_yAs_{1-y}$ ($0 \leq x < 1$, $0 \leq y < 1$, $0 < z < 1$) having a lattice constant match with crystalline InP and two barrier layers of crystalline $(Al_{x'}Ga_{1-x'})_{1-z}In_zP_yAs_{1-y}$ ($x < x' \leq 1$) having a lattice constant match with crystalline InP, the barrier layers sandwiching the well layer, including a region wherein a dopant impurity such as Si and Zn has been diffused, having a substantially uniform crystalline composition of $(Al_pGa_{1-p})In_zP_yAs_{1-y}$ ($0 < p < 1$) so that distinct well and barrier layers are not present, and having a lattice constant match with crystalline InP.

2. A semiconductor optical element as defined in claim 1 wherein the composition of said well layer is $In_{0.53}Ga_{0.47}As$, the composition of said barrier layers is $(Al_pGa_{1-p})_{0.47}In_{0.53}As$ ($0 < p < 1$), and the composition of said region is $(Al_gGa_{1-g})_{0.47}In_{0.53}As$ ($0 < g < p$).

3. A semiconductor optical element comprising:
a semi-insulating InP substrate;
a first cladding layer comprising a first conductivity type $(Al_gGa_{1-g})_{0.47}In_{0.53}As$ ($0 < g \leq 1$) disposed on said substrate;
a quantum well structure active layer comprising at least one $In_{0.53}Ga_{0.47}As$ well layer and at least two $(Al_pGa_{1-p})_{0.47}In_{0.53}As$ ($0 < p \leq g$) barrier layers sandwiching the well layer disposed on said first cladding layer;
a second cladding layer comprising a second conductivity type $(Al_gGa_{1-g})_{0.47}In_{0.53}As$ disposed on said active layer; and
first and second spaced apart crystalline regions in said active layer on opposite sides of a stripe-shaped active portion of said active layer, said first and second regions containing first and second diffused dopant impurities producing the first and second conductivity types, respectively, so that the first and second regions have substantially uniform crystalline compositions of $(Al_rGa_{1-r})_{0.47}In_{0.53}Ga_{0.47}$ ($p < r < g$).

4. A semiconductor optical element as defined in claim 3 wherein said first and second impurities producing the first and second conductivity types are Si and Zn, respectively.

5. A semiconductor optical element as defined in claim 3 including coplanar first and second electrodes respectively disposed on said first and second crystalline disordered regions.

* * * * *